(12) United States Patent
Choi (10) Patent No.: US 6,442,071 B2
(45) Date of Patent: Aug. 27, 2002

(54) NON-VOLATILE SEMICONDUCTOR MEMORY DEVICE WITH IMPROVED ERASE ALGORITHM

(75) Inventor: Ki-Hwan Choi, Kyunggi-do (KR)

(73) Assignee: Samsung Electronics Co., Ltd., Hwasung (KR)

( * ) Notice: Subject to any disclaimer, the term of this patent is extended or adjusted under 35 U.S.C. 154(b) by 125 days.

(21) Appl. No.: 09/731,537

(22) Filed: Dec. 6, 2000

(30) Foreign Application Priority Data

Dec. 6, 1999 (KR) ............................................. 99-55214

(51) Int. Cl.$^7$ .............................................. G11C 16/06
(52) U.S. Cl. .................................. 365/185.22; 185/185.3
(58) Field of Search ...................... 365/185.22, 185.29, 365/185.3, 189.09, 185.24, 185.33

(56) References Cited

U.S. PATENT DOCUMENTS

| | | |
|---|---|---|
| 5,132,935 A | 7/1992 | Ashmore, Jr. et al. |
| 5,220,533 A | 6/1993 | Turner |
| 5,513,193 A | 4/1996 | Hashimoto |
| 5,636,162 A * | 6/1997 | Coffman ................ 365/185.22 |
| 5,781,477 A | 7/1998 | Rinerson et al. |
| 5,805,501 A | 9/1998 | Shiau et al. |

OTHER PUBLICATIONS

Atoumi, et al. "A 3.3V–only 16Mb Flash Memory with Row–Decoding Scheme"; ISSCC 96/Flash Memory Paper TP 2.6, pp. 42–43, Feb. 1996.

* cited by examiner

*Primary Examiner*—David Lam
(74) *Attorney, Agent, or Firm*—Marger Jonson & McCollom, P.C.

(57) ABSTRACT

A flash memory device with an improved erase algorithm for erasing a plurality of memory cells that are arranged in intersections of wordlines and bitlines, respectively, includes an array of the memory cells. In the erase algorithm, all memory cells of the sector are erased at the same time. A pass/fail check & control logic then checks whether the memory cells are overerased. When one of a group of the erased memory cells is overerased, soft-program voltages are applied to the overerased memory cells such that the over-erased memory cells become soft-programmed. After boosting one of the soft-program voltages, the operations of checking, soft-programming, and boosting are carried out repeatedly, until a threshold voltage of the overerased memory cell moves within a target threshold voltage range of the erased memory cell. Therefore, overerasing is cured based upon program characteristics, without overcuring.

7 Claims, 6 Drawing Sheets

Fig. 1

(Prior Art)

NON-VOLATILE SEMICONDUCTOR MEMORY DEVICE WITH IMPROVED ERASE ALGORITHM

This application relies for priority upon Korean Patent Application No. 1999-55214, filed on Dec. 6, 1999, the contents of which are herein incorporated by reference in their entirety.

FIELD OF THE INVENTION

The present invention relates to memory devices and, more particularly, to a nonvolatile semiconductor memory device with an erase algorithm to electrically erasable and programmable read only memory (EEPROM) cells.

BACKGROUND OF THE INVENTION

Figure 1:
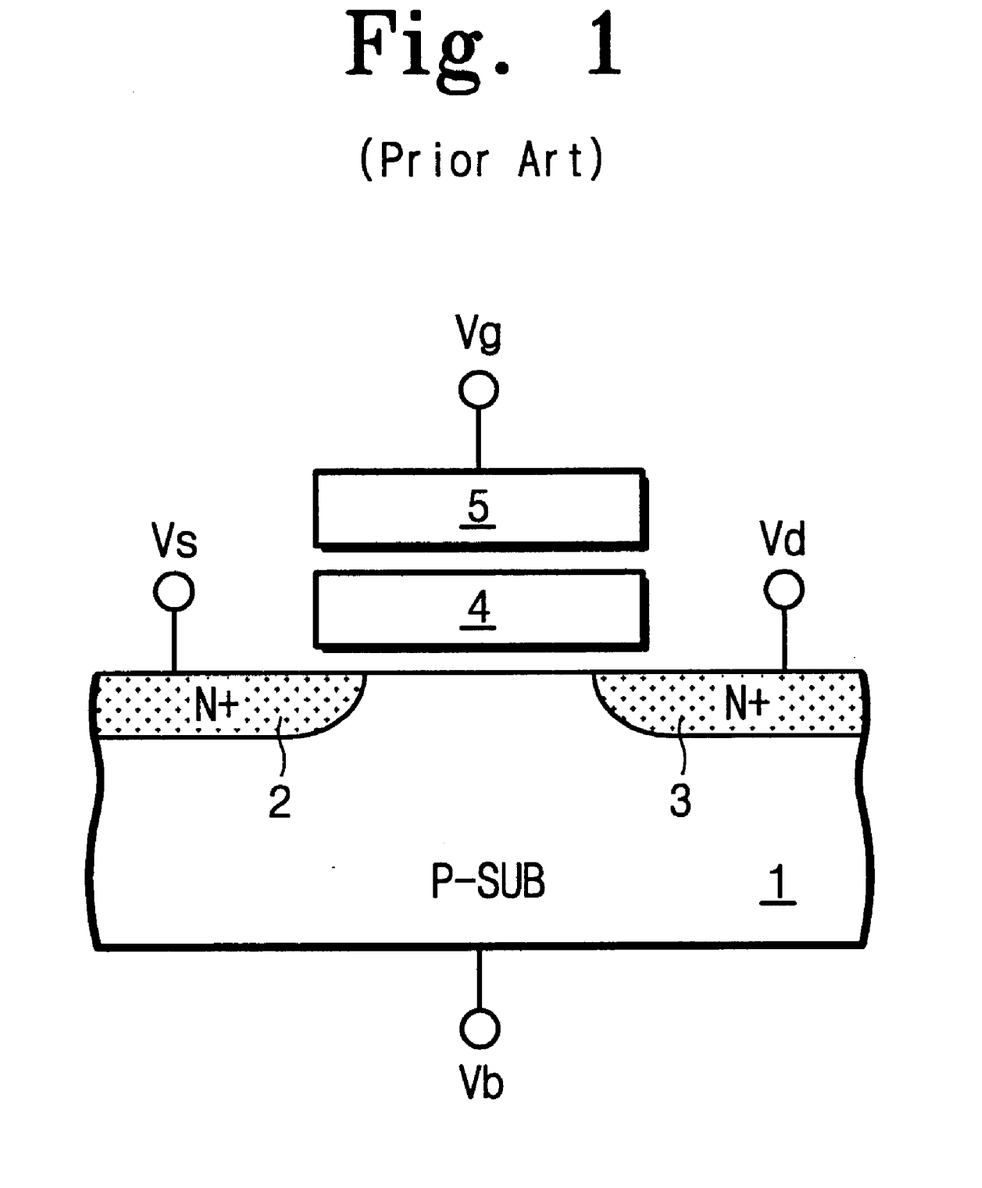
FIG. 1 is a cross-sectional view of an electrically erasable and programmable read only memory (EEPROM) cell in the prior art.

FIG. 1 is a cross-sectional view of an EEPROM cell in the prior art. The EEPROM cell has source and drain regions 2 and 3, a floating gate 4, and a control gate 5. The source and drain regions 2 and 3 are formed in a P-type semiconductor substrate (or bulk) 1. The floating gate 4 is formed on a channel region with an insulating layer having a thickness of about 100 Å interposed therebetween. The channel region is formed between the source and drain regions 2 and 3. The control gate 5 is formed on the floating gate with another insulating layer interposed therebetween.

As a non-volatile semiconductor memory device, a NOR-type flash memory device includes an array of sectors for storing information. Each of the sectors has EEPROM cells in which rows (e.g., wordlines) and columns (e.g., bitlines) are arranged in a matrix type arrangement. At each sector as an erase unit, an erase operation of the NOR-type flash memory device is carried out to erase all EEPROM cells in one sector at the same time. Various erase methods related with a flash memory device are disclosed in U.S. Pat. Nos. 5,781,477, 5,132,935, 5,220,533, 5,513,193, and 5,805,501.

Figure 2:
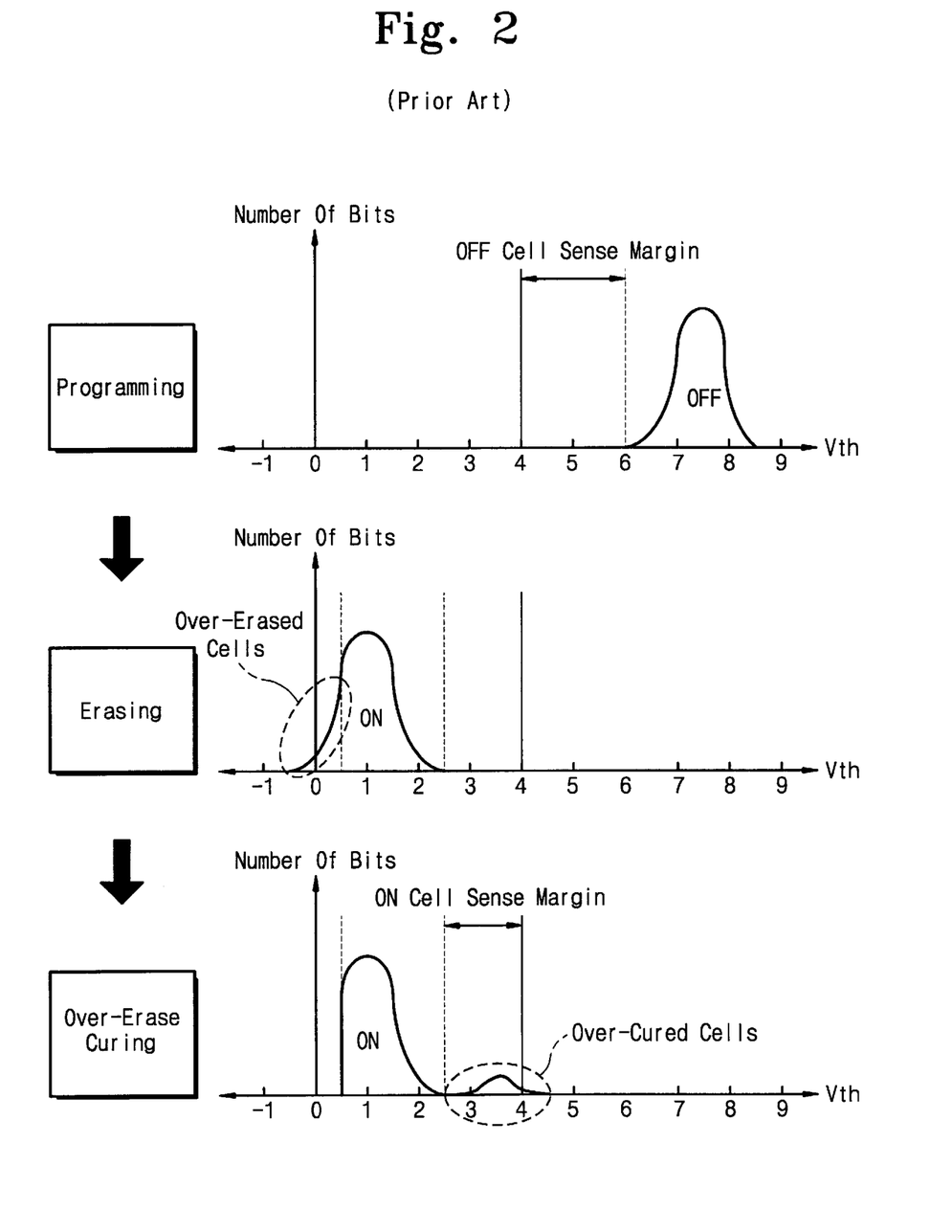
FIG. 2 is three graphs which, taken in succession, illustrate an erase algorithm in the prior art.

All EEPROM cells, which are provided to a selected cell of a NOR-type flash memory device, are erased through a series of program, erase, and over-erase cure operations, as shown in FIG. 2. During the programming operation, voltages Vs and Vb, of 0V, are applied to a source and a bulk, respectively, a gate voltage Vg of about 10V is applied to a control gate, and 5V voltage suitable for creating a hot electron is applied to a drain. Accordingly, each of EEPROM cells is programmed. Upon the bias condition, sufficient amount of negative charges are accumulated in a floating gate of each of the EEPROM, so that the floating gate has a negative potential. The programmed EEPROM cell is called an "OFF cell", and has a threshold voltage which exists within a target threshold voltage range (e.g., about 6V–8.5V) corresponding to the OFF cell.

Then the erasing operation takes place. All the EEPROM cells in the selected cell are erased at the same time by an F-N (Fowler-Nordheim) tunneling scheme. Upon the F-N tunneling scheme, about a gate voltage Vg of –10V is applied to a control gate of each cell, and a voltage Vb of 5V suitable for generating the F-N tunneling is applied to a semiconductor substrate. In this case, a source and a drain are situated in a floating state. Such an erase scheme is called a negative gated bulk erase (NGBE) operation. During the NGBE operation, a strong electric field of about 6–7MV/cm is established between the control gate and the semiconductor substrate, so that the F-N tunneling is induced. Thus, the charges accumulated in the floating gate move from the floating gate into the substrate (or bulk) through a thin insulating layer of about 100 Å. The erased EEPROM cell is called an "ON cell", and has a threshold voltage which exists within a target threshold voltage range (e.g., about 0.5V–2.5V) corresponding to the ON cell.

Erasure may result in over-erasure. Over-erasure is cured in the prior art as follows.

After the NGBE operation, it is checked whether all the EEPROM cells in a sector exist within a target threshold voltage range (e.g., 0.5V–2.5V) corresponding to an ON cell. After simultaneously erasing all the EEPROM cells of the sector, an EEPROM cell having a threshold voltage of 0.5V or less is created. Conventionally, such an EEPROM cell is called "over-erased cell", which can be erased by an over-erase curing operation (or erase repair operation). As a result, a threshold voltage of the over-erased EEPROM cell can be distributed within a target threshold voltage range corresponding to an ON state.

In the over-erase curing operation, a source of an over-erased EEPROM cell and a semiconductor substrate are grounded. A voltage Vg of about 3V–5V is applied to a control gate. And, a voltage Vd about 5V is applied to a drain for a predetermined time. Upon such a bias condition, negative charges, which are less than those of a program operation in amount, are accumulated in a floating gate. Thus, the foregoing over-erase curing operation is carried out to move the threshold voltage of the over-erased cell within the target threshold voltage range. Voltages Vg, Vd, Vs, Vb, which are applied to the over-erased EEPROM cell during the over-erased cure operation, are called "soft-program voltages".

In the foregoing erase method, as shown in FIG. 2, there are over-cured (or over-programmed) EEPROM cells, which remain over-cured even after the over-erased cure operation. These cells can be erased by carrying sequential steps of program, erase, and over-erase curing operation again.

When a read operation is carried out, the over-cured EEPROM cell scarcely has an ON cell sensing margin left. In the worst case, the over-cured EEPROM cell can even be sensed as an OFF cell. One of the causes to generate such a phenomenon is too wide a target threshold voltage range corresponding to an ON cell. Namely, the phenomenon results from diversity of program and erase characteristics (e.g., program and erase speed) of each EEPROM cell. More specifically, this will be described as follows.

As an integration level of a flash memory device increases, a size (especially, channel width) of each EEPROM cell has been reduced. This leads to reduction of charges stored in a floating gate. Accordingly, even though change in a manufacturing process is little, a difference of program and erase characteristics becomes great. And, as an EEPROM cell size becomes small, the process is variously changed to diversify program and erase characteristics of the EEPROM cell. Upon the identical bias condition, it is known that such a phenomenon is caused by disparity between capacitance elements of each cell, change in thickness of a tunnel oxide layer, doping concentration of a floating gate, and so on.

Figure 3:
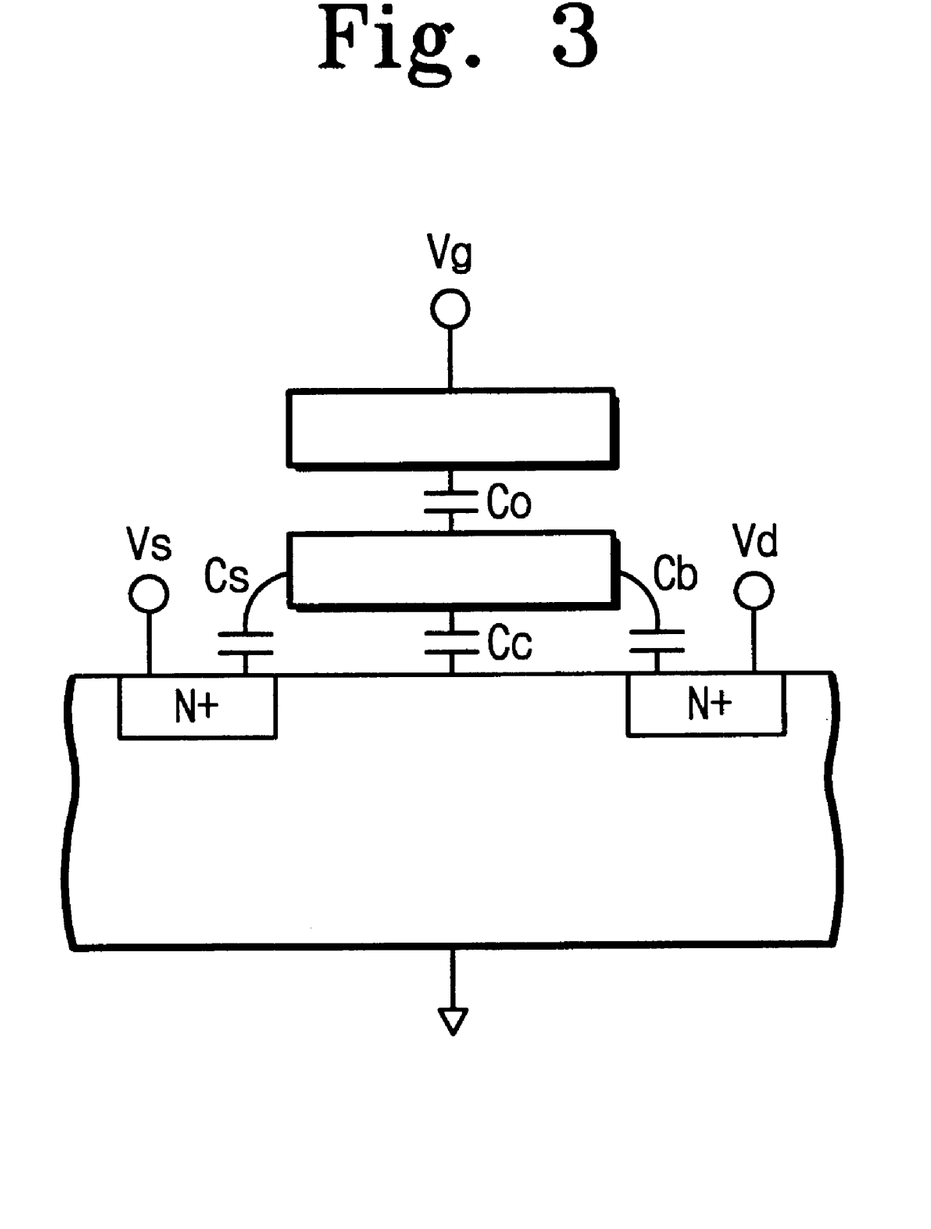
FIG. 3 shows capacitance elements in a memory cell.

In FIG. 3, the symbols Co, Cs, and Cc denote capacitance between a wordline and a floating gate, capacitance between a floating gate and a source, and a channel capacitance, respectively.

Out of the capacitance elements in each cell, a drain coupling ratio (DCR) has a great influence on the program and erase characteristics. As an integration level of a memory device increases (i.e., an EEPROM cell size becomes small), the DCR becomes greater. Therefore, the program and erase characteristics are more diversified (a threshold voltage range corresponding to an ON cell becomes wider). As known by the following equation, the DCR is decided by a ratio of capacitance (Cb) between a bitline node of a cell and a floating gate to total capacitance (Co+Cs+Cb+Cc), as represented hereinbelow.

$$DCR=Cb/Co+Cs+Cb+Cc$$

For example, a voltage Vf induced to a floating gate of an unselected EEPROM cell coupled to the same column as one selected cell is decided by a drain coupling ratio DCR×Vd. If the DCR is 0.1 and a bitline voltage Vd is 5V, a voltage about 0.5V is induced to the floating gate of the unselected cell. If the threshold voltage of the unselected cell is 0.5V, an unselected EEPROM cell is conducted, even though a voltage of 0V is applied to a control gate of the unselected cell. Thus, a current about 1 $\mu$A flows through the unselected EEPROM cell. During a program operation, a voltage on a bitline of a selected cell becomes low by the drain coupling effect of a plurality of unselected cells that are coupled to the selected column. This prevents the selected cell from being programmed. Similarly to the program operation, a read operation cannot be carried out because a current flows through an unselected cell by the above-mentioned drain coupling effect.

And, a voltage of a flash memory device becomes low, widening a threshold voltage range of an ON cell. A maximum value (upper limited value) of the threshold voltage range becomes small because a wordline voltage (gate voltage) becomes low according to trend toward a low voltage. This causes increase in over-erased EEPROM cells. Namely, a target threshold voltage range corresponding to an ON cell is widened. And, a minimum value of the threshold voltage range corresponding to the ON cell is decided by considering the above-mentioned drain coupling effect.

As the threshold voltage range corresponding to the ON cell is widened, the number of the over-erased EEPROM cells increases. Using specific soft-program voltages Vd=5V, Vg=3V–5V, Vb=0V, and Vs=0V (these voltage are decided with reference to typical cells), a conventional cure operation for curing the over-erased cells is carried out. However, since the conventional cure operation does not consider program characteristics (e.g., program speed) of the EEPROM cells, over-erased EEROM cells can be created, as shown in FIG. 2. Soft-program voltages such as a gate voltage (wordline voltage) or a drain voltage (bitline voltage) of lower levels are applied to over-erased EEPROM cells during the over-erased cure operation, preventing over-erased cure of EEPROM cells. In this case, since a time taken for the over-erased cure operation increases, the total time also increases.

SUMMARY OF THE INVENTION

It is an object of the present invention to provide a non-volatile semiconductor memory device, which is able to cure its over-erased cells without over-curing them.

It is another object of the invention to provide a method for curing overerased cells without over curing them.

The invention provides a flash memory device with a sector of an electrically erasable and programmable read only memory (EEPROM) cells that are arranged at intersections of rows and columns. The device includes a row selection circuit for selecting one of the rows in response to a row address, a column selection circuit for selecting a part of the columns in response to a column address, a row address generator for generating the row address, and a column address generator for generating the column address.

The device also includes a high voltage generator for generating a wordline voltage and a bitline voltage which are to be applied to the selected EEPROM cell, and a control circuit for checking whether at least one of the selected EEPROM cells is over-erased during an over-erase cure operation.

A loop counter executes count up operations in the row address generator and the column address generator to step through all the cells. A pass/fail check & control logic then checks whether the memory cells are over-erased. If it is determined that one of the selected EEPROM cells is over-erased, the control circuit controls a step counter, to cause the high voltage generator to iteratively increase one of the bitline and wordline voltages. The gradual increase cures the over erasure, but without overcuring it.

According to an aspect of the present invention, there is an erase algorithm of a flash memory device. In the erase algorithm, all memory cells of the sector are erased at the same time. When one of a group of the erased memory cells is over-erased, soft-program voltages are applied to the over-erased memory cell such that the over-erased memory cell is soft-programmed. After incrementally boosting up one of the soft-program voltages, the operations of checking, and soft-programming are iteratively carried out until a threshold voltage of the over-erased memory cell moves within a target threshold voltage range of the erased memory cell.

Depending on such an erase algorithm, over-erased cells can be cured according to program characteristics without giving rise to an over-curing phenomenon.

DESCRIPTION OF THE PREFERRED EMBODIMENT

Figure 4:
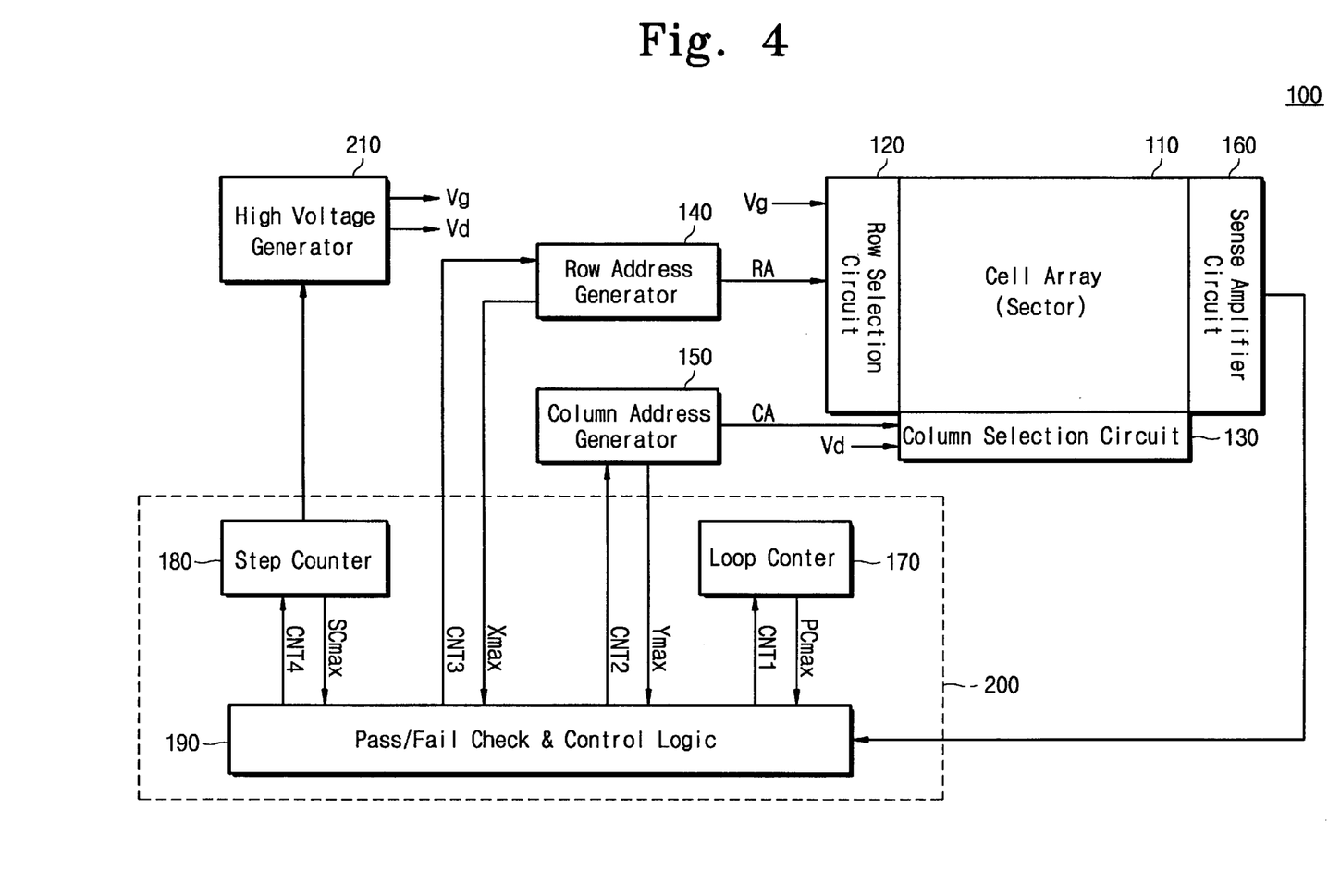
FIG. 4 is a schematic section of an EEPROM cell involved in capacitance elements in accordance with the present invention.

Referring now to FIG. 4, a flash memory device 100 includes an array 110 of EEPROM cells having the same architecture as shown in FIG. 1. Each of the EEPROM cells is arranged in an intersection of rows and columns. Although not shown in the drawings, it will be understood that a plurality of wordlines extending toward rows and a plurality of bitlines extending toward columns are provided to the array 110. The provided EEPROM cells are erased at the same time, which means that the EEPROM cells of the array 110 are formed in a single bulk of semiconductor substrate.

As an erase unit, the array 110 shown in FIG. 4 corresponds to a sector (or block). A NOR-type flash memory device having an array of block or sector architecture is disclosed in a paper titled "A 3.3V-only 16 Mb Flash Memory with Row-Decoding Scheme", published by IEEE International Solid State Circuits, pp. 42–43, Feb. 8, 1996.

A NOR-type flash memory device disclosed in the paper includes an array that is classified into a plurality of sectors or blocks. Bulk areas in each of the sectors are electrically isolated from each other. EEPROM cells integrated in each of the sectors are erased at the same time during the above-mentioned erase operation (NGBE operation). Each of the sectors is composed of an erase unit. Wordlines and bitlines in each of the sectors are individually selected with other sector. Such architecture enables a program/erase operation to be carried out without disturbance. As a result, high reliability can be achieved.

Continuing to refer to FIG. 4, a row selection circuit 120, a column selection circuit 130, a row address generator 140, a column address generator 150, and a sense amplifier circuit 160 are provided to the flash memory device 100. The row selection circuit 120 selects one of the wordlines in response to a row address RA generated from the row address generator 140. And, the row selection circuit 120 supplies a wordline voltage (or gate voltage) required for one operation (e.g., program operation, erase operation, read operation, erase verify operation, erase repair operation, etc.) to the selected wordline.

The column selection circuit 130 selects a part (word- or byte-unit bitlines) of the bitlines in response to a column address CA generated from the column address generator 150. Similarly, the column selection circuit 130 supplies a voltage (e.g., drain voltage) and a current (e.g., drain current) required for one operation to the selected bitlines. The sense amplifier circuit 160 senses and amplifies data bits of EEPROM cells arranged in intersections of rows and columns that are selected by the selection circuits 120 and 130.

It is understood to those skilled in the art that the column address generator 140 and the column address generator 150 can be composed of a counter (hereafter referred to as an X-counter and Y-counter, respectively).

Still referring to FIG. 4, an erase control circuit 200 for controlling an erase operation of EEPROM cells arranged in the array 110 is provided to the flash memory device 100. The erase control circuit 200 is composed of a loop counter 170, a step counter 180, and a pass/fail check & control logic 190.

Control circuit 200 is for checking whether at least one of the selected EEPROM cells is over-erased during an over-erase cure operation, and for controlling the high voltage generator in response to data bits from the sense amplifier circuit during the over-erase cure operation. If it is determined that at least one of the selected EEPROM cells is over-erased, the control circuit controls the high voltage generator so as to iteratively increase one of the bitline and wordline voltages. If the selected EEPROM cells have threshold voltages within a target threshold voltage range, the control circuit controls the high voltage generator so as to hold the wordline and bitline voltages to initial levels.

Control circuit 200 makes the row address generator 140 execute a count-up operation when an over-erase cure operation to the selected row is finished. It also makes the column address generator 150 execute another count-up operation when an over-erase cure operation to the selected columns is finished. Loop counter 170 executes the count-up operations, and step counter 180 controls the high voltage generator that is described immediately below.

A high voltage generator 210 is provided to the flash memory device 100. The high voltage generator 210 generates a wordline voltage (or gate voltage) Vg and a bitline voltage (or drain voltage) Vd, based upon control of the erase control circuit 200.

Now, an erase operation will be described in detail hereinafter with reference to FIG. 4 through FIG. 6. As mentioned above, EEPROM cells provided to one sector are erased at the same time through a series of program, NGBE, and over-erased cure operations. The program and NGBE operations are carried out same as described in FIG. 2, so that description thereof will be skipped herein. After carrying out the NGBE operation, it is checked whether over-erased EEPROM cells exist. If so, a program operation is carried out such that the over-erased EEPROM cells have a threshold voltage within a target threshold voltage range corresponding to an ON cell. This is described more fully, as follows.

If an over-erased cure operation is started, values X, SC, Y, and PC of an X-counter 140, a step counter 180, a Y-counter 150, and a loop counter 170 are initialized to "0" through a series of steps S10, S20, and S30. In step S40, a pass/fail check & control logic 190 checks whether EEPROM cells indicated by the values of the counters 140 and 150 are over-erased. Namely, a voltage Vg of about 2V is applied to each control gate of the selected EEPROM cells, and a voltage Vd of about 1V is applied to a drain thereof. Upon such a condition, the sense amplifier circuit 160 carries out a read operation (generally, referred to as "over-erase verify operation").

If all the selected EEPROM cells have threshold voltages within the target threshold voltage range, step S40 proceeds to step S60 by way of step S50 wherein the value SC of the step counter 180 is initialized to "0". In step S60, the pass/fail check & control logic 190 checks whether a value Y of the Y-counter 150 is matched with a maximum value Ymax. If Y is not matched with Ymax, after the value Y is counted up at step S70 by the control logic 200 so as to select another group of columns, step S60 returns to step S30. If Y is matched with Ymax, step S60 proceeds to S80 wherein the pass/fail check and control logic 190 checks whether a value X of the X-counter is matched with a maximum value Xmax. If X is not matched with Xmax, step S80 proceeds to step S20 by way of step S90 wherein X is counted up by control of the pass/fail check & control logic so as to select a wordline of the next row. If X is matched with Xmax, step S80 proceeds to step S100 wherein the over-erase cure operation is finished (pass). All EEPROM cells in a sector may be selected through the foregoing steps.

Referring to step S40, if at least one of the selected EEPROM cells is at ON state (i.e., over-erased), step S40 proceeds to step S120 by way of step S110 wherein it is checked whether a value of PC of the loop counter 170 is matched with a maximum value PCmax. In step S120, a soft-program operation is carried out. PCmax is to limit cure operation times to selected cells. If PC is matched with PCmax, step S110 proceeds to step S130 wherein the over-erase cure operation is finished (fail).

In comparison with a prior art, a soft-program operation of this invention is carried out upon conditions that a voltage Vg of about 3V–5V is applied to each control gate of the over-erased cells, a voltage Vd of about 4.5V is applied to a drain thereof, and a source and bulk are grounded. When SC is set to "0", a voltage of 4.5V (lower than 5V of a prior art) is applied to a drain of the over-erased EEPROM cell. Upon such a bias condition, cells having a fast program speed may be cured, out of the over-erased EEPROM cells.

In step S140, the value PC of the loop counter 170 is counted up as much as "1" by a control signal CNT1 generated from the pass/fail check and control logic 190. In step S150, the pass/fail check and control logic 190 checks whether a current value SC of the step counter 180 is matched with a maximum value SCmax. If SC is not matched with SCmax, step S150 returns to step S40 by way of step S160 wherein SC is counted up by a control signal CTN4 generated from the pass/fail check and control logic 190. If SC is matched with SCmax, step S150 proceeds to step S40 without a count-up operation.

If the value SC of the step counter 180 is counted up, the high voltage generator 210 generates a bitline voltage Vd applied to the drain of the over-erased EEPROM cell in response to SC, with boosting up as much as a predetermined level. For example, when SC is counted up at an initial value ("0"), the high voltage generator 210 generates a voltage Vd of about 5V that is higher than the bitline voltage of 4.5V, as shown in FIG. 6. On the other hand, it is understood to those skilled in the art that a wordline voltage control scheme may be used instead of the bitline voltage control scheme. On condition that a bitline voltage is set to a specific level (e.g., 5V), it can use a control scheme to gradually increase a wordline voltage when a value SC of a step counter 180 is increased.

Similarly to the foregoing manner, it is checked whether selected EEPROM cells (cells indicated by initially set row and column addresses) are over-erased again after a soft-program operation to the over-erased EEPROM cells is carried out (S40). When at least one of the selected EEPROM cells are still over-erased, step S40 proceeds to step S120 by way of step S110. Except for the fact that a soft-program operation is carried out using a bitline voltage Vd of 5V (or increased wordline voltage Vg) instead of 4.5V, the soft-program operation is identical to the above. Thus, out of the over-erased EEPROM cells, cells having a slightly slow program speed can be cured. Similar to the foregoing description, steps S140, S150, and S160 are then carried out.

Figure 6:
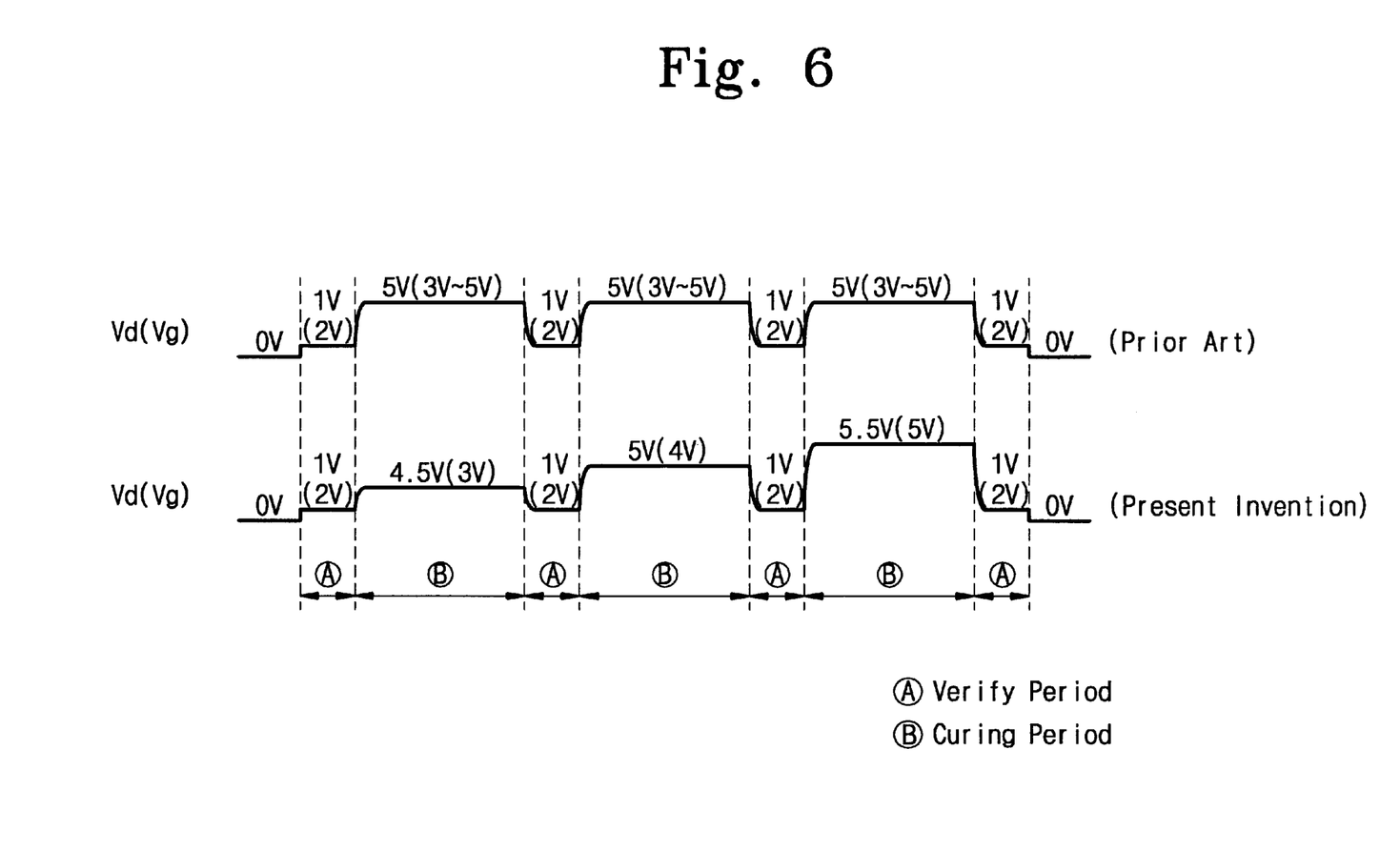
FIG. 6 shows waveforms of bitline voltages (or wordline voltages) that are used in an over-erased cure operation in accordance with a prior art and the present invention, respectively.

As shown in FIG. 6, during an over-erase cure operation, a bitline voltage (or wordline voltage) is gradually increased (i.e., program characteristics are considered) to carry out a soft-program operation (S120). Thus, over-erased EEPROM cells have threshold voltages within a target threshold voltage range (e.g., 0.5V–2.5V) without an over-cure phenomenon.

Figure 5:
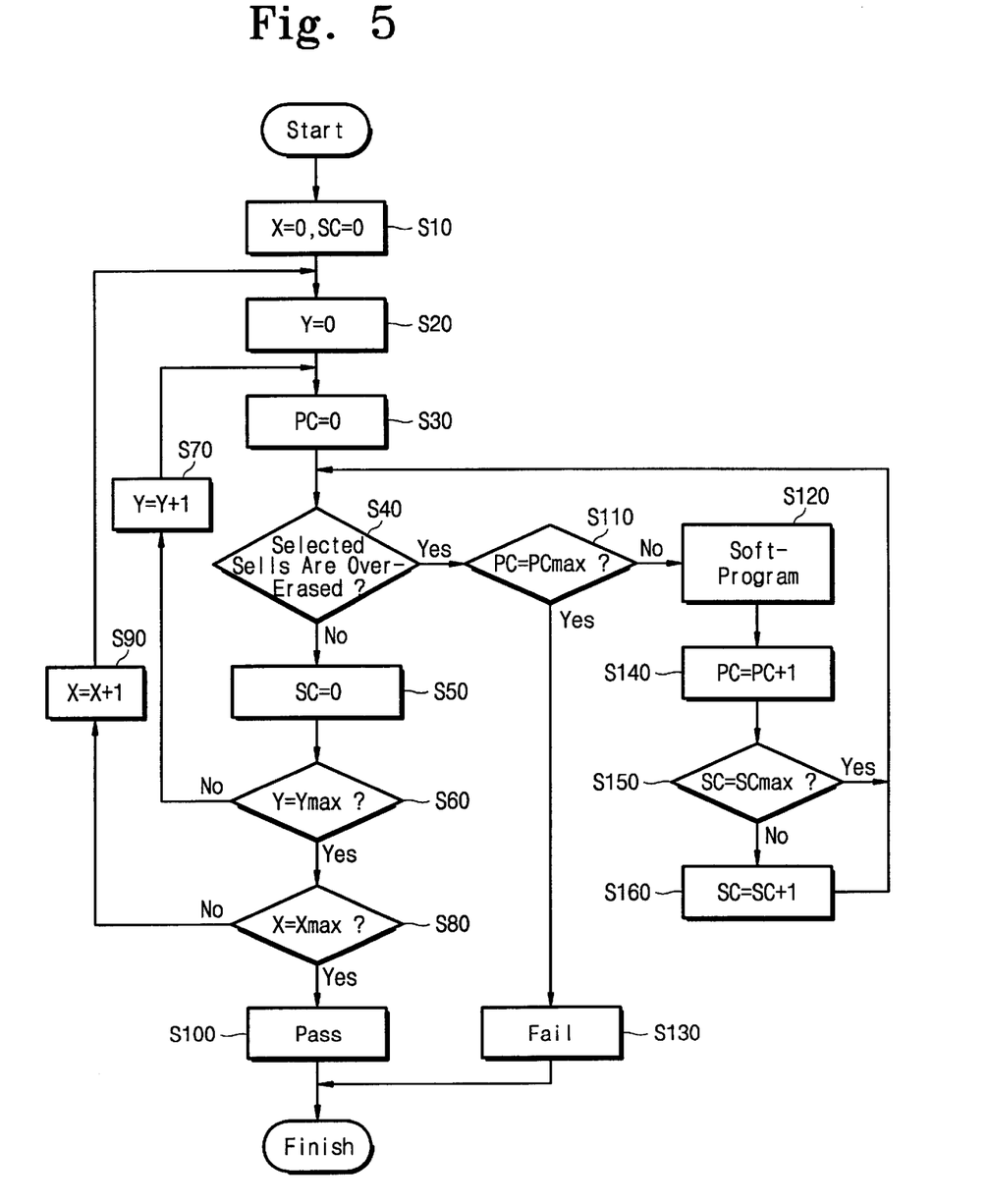
FIG. 5 is a flowchart for explaining an over-erased cure operation in accordance with the present invention.

If the over-erased EEPROM cells are not cured until a value SC of a step counter 180 is matched with a maximum value SCmax, the foregoing steps S40, S110, S120, S140, S150, and S160 are repeatedly carried out using a bitline voltage (e.g., 5.5V) or a wordline voltage (5V) until a value PC of a loop counter 170 arrives at a maximum value PCmax, as shown in FIG. 5.

As described so far, a soft-program voltage (e.g., bitline voltage or wordline voltage) is gradually increased to carry out a soft-program operation, curing over-erased EEPROM cells depending upon program characteristics, without giving rise to an over-cure phenomenon.

Although the present invention has been described in conjunction with its preferred embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. An erase method of a non-volatile semiconductor memory device having a plurality of memory cells that are arranged in intersections of wordlines and bitlines, respectively, the method comprising the steps of:

after erasing the memory cells at the same time, checking whether the memory cells are over-erased;

if a group of the erased memory cells are over-erased, programming the over-erased memory cell to which a soft-program voltage is applied;

boosting up the soft-program voltage; and repeatedly carrying out the checking, programming, and boosting operations until a threshold voltage of the over-erased memory cell moves to a target threshold voltage range of an erased memory cell.

2. The method of claim 1, wherein the non-volatile semiconductor memory device includes a NOR-type flash memory device.

3. The method of claim 1, wherein the soft-program voltage is applied to a bitline.

4. The method of claim 1, wherein the soft-program voltage is applied to a wordline.

5. A non-volatile semiconductor memory device comprising:

an array of electrically erasable and programmable read only memory (EEPROM) cells in which rows and columns -are arranged;

a row selection circuit for selecting at least one of the rows in response to a row address;

a column selection circuit for selecting a part of the columns in response to a column address;

a sense amplifier circuit for sensing and amplifying data bits stored in EEPROM cells arranged at the selected row and the selected columns;

a high voltage generator for generating a wordline voltage and a bitline voltage which will be applied to the selected EEPROM cell; and a control circuit for controlling the high voltage generator in response to data bits from the sense amplifier circuit during the over-erase cure operation, wherein the control circuit checks whether the selected EEPROM cells are over-erased during the over-erase cure operation; if at least one of the selected EEPROM cells is over-erased, the control circuit controls the high voltage generator so as to increase one of the bitline and wordline voltages; and if the selected EEPROM cells have threshold voltages within a target threshold voltage range, the control circuit control the high voltage generator so as to hold the wordline and bitline voltages to initial levels.

6. The device of claim 5 further comprising a row address generator for the row address and a column address generator for generating the column address, wherein the control circuit makes the row address generator carry out a count-up operation when an over-erase cure operation to the selected row is finished, and makes the row address generator carry out the count-up operation when an over-erase cure operation to the selected columns is finished.

7. An erase method of a flash memory device including a sector of electrically erasable and programmable read only memory (EEPROM) cells that are arranged in intersections of rows and columns, respectively, a row selection circuit for selecting one of the rows in response to a row address, a column selection circuit for selecting a part of the columns in response to a column address, a row address generator for generating the row address, and a column address generator for generating the column address, the method comprising the steps of:

programming all EEPROM cells to have threshold voltages corresponding to an OFF cell; and carrying out an over-erase cure operation after erasing all the EEPROM cells in the sector at the same time, wherein the over-erase cure operation is carried out by carrying out the steps of:

initializing values of the row and column address generators to "0";

checking whether EEPROM cells indicated by the values are over-erased;

if at least one of the indicated EEPROM cells is over-erased, programming the over-erased EEPROM cells by applying a wordline voltage and a bitline voltage to a control gate of the over-erased EEPROM cell and a drain thereof, respectively;

after boosting up one of the wordline and bitline voltages, repeatedly carrying out the checking, programming, and boosting steps until a threshold voltage of the over-erased EEPROM cell moves within a target threshold voltage range of the EEPROM cell.

* * * * *

UNITED STATES PATENT AND TRADEMARK OFFICE
CERTIFICATE OF CORRECTION

PATENT NO.     : 6,442,071 B2
DATED          : August 27, 2002
INVENTOR(S)    : Choi It is certified that error appears in the above-identified patent and that said Letters Patent is hereby corrected as shown below:

<u>Title page,</u>
Item [57], ABSTRACT,
Line 10, "over-erased" should read -- overerased --;

<u>Column 1,</u>
Line 12, "nonvolatile" should read -- non-volatile --;

<u>Column 8,</u>
Line 21, "columns -are" should read -- columns are --.

Signed and Sealed this

Fourth Day of March, 2003

JAMES E. ROGAN
*Director of the United States Patent and Trademark Office*